(12) United States Patent
Kamada

(10) Patent No.: US 11,201,235 B2
(45) Date of Patent: Dec. 14, 2021

(54) SEMICONDUCTOR DEVICE, METHOD FOR PRODUCING SEMICONDUCTOR DEVICE, POWER SUPPLY DEVICE, AND AMPLIFIER

(71) Applicant: FUJITSU LIMITED, Kawasaki (JP)

(72) Inventor: Youichi Kamada, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 28 days.

(21) Appl. No.: 16/673,275

(22) Filed: Nov. 4, 2019

(65) Prior Publication Data
US 2020/0161464 A1 May 21, 2020

(30) Foreign Application Priority Data

Nov. 21, 2018 (JP) .............................. JP2018-218586

(51) Int. Cl.
| | |
|---|---|
| *H01L 29/778* | (2006.01) |
| *H01L 29/40* | (2006.01) |
| *H01L 29/66* | (2006.01) |
| *H01L 29/205* | (2006.01) |
| *H01L 23/31* | (2006.01) |
| *H01L 23/29* | (2006.01) |
| *H01L 29/20* | (2006.01) |

(52) U.S. Cl.
CPC ...... *H01L 29/7787* (2013.01); *H01L 29/2003* (2013.01); *H01L 29/205* (2013.01); *H01L 29/401* (2013.01); *H01L 29/66462* (2013.01)

(58) Field of Classification Search
CPC .................................................. H01L 29/7787
See application file for complete search history.

(56) References Cited

U.S. PATENT DOCUMENTS

| 6,528,405 B1 * | 3/2003 | Martinez | ........... H01L 29/66462 |
|---|---|---|---|
| | | | 257/192 |
| 2005/0139838 A1 * | 6/2005 | Murata | ............. H01L 29/66871 |
| | | | 257/73 |

FOREIGN PATENT DOCUMENTS

| JP | 2002-359256 | 12/2002 | |
|---|---|---|---|
| JP | 2007-173426 | 7/2007 | |
| JP | 2012-234984 | 11/2012 | |
| JP | 2015-012037 | 1/2015 | |
| JP | 2015012037 A | * 1/2015 | ........... H01L 29/778 |

* cited by examiner

*Primary Examiner* — Omar F Mojaddedi
(74) *Attorney, Agent, or Firm* — Fujitsu Patent Center

(57) ABSTRACT

A semiconductor device includes a substrate; a first semiconductor layer and a second semiconductor layer, both including a nitride semiconductor; a gate electrode; a source electrode; a drain electrode formed on the second semiconductor layer; and a first insulating film and a second insulating film formed on the second semiconductor layer. The first insulating film is formed on a gate-electrode side and the second insulating film is formed on a drain-electrode side between the gate electrode and the drain electrode. A part of the gate electrode is formed on the first insulating film. The first insulating film and the second insulating film are formed of silicon nitride. The Si—H bond density in the first insulating film is higher than that in the second insulating film. The N—H bond density in the second insulating film is higher than that in the first insulating film.

9 Claims, 20 Drawing Sheets

FIG.8

|  | Si-H BOND | N-H BOND | REFRACTIVE INDEX ($\lambda = 633$ nm) |
|---|---|---|---|
| FIRST INSULATING FILM 31 | $1.0 \times 10^{22}/cm^3$ | $1.0 \times 10^{21}/cm^3$ | 2.05 |
| SECOND INSULATING FILM 32 | $1.0 \times 10^{21}/cm^3$ | $1.0 \times 10^{22}/cm^3$ | 1.90 |

//  # SEMICONDUCTOR DEVICE, METHOD FOR PRODUCING SEMICONDUCTOR DEVICE, POWER SUPPLY DEVICE, AND AMPLIFIER

CROSS-REFERENCE TO RELATED APPLICATIONS

This application is based on and claims priority to Japanese Patent Application No. 2018-218586, filed on Nov. 21, 2018, the entire contents of which are incorporated herein by reference.

FIELD

The following disclosure relates to a semiconductor device, a method for producing the semiconductor device, a power supply device, and an amplifier.

BACKGROUND

Application of nitride semiconductors to semiconductor devices with high breakdown voltage and high power has been studied by utilizing characteristics such as a high electron saturation velocity and a wide band gap. For example, the band gap of GaN, which is a nitride semiconductor, is 3.4 eV, which is greater than the 1.1 eV band gap of Si and the 1.4 eV band gap of GaAs. Further, nitride semiconductors have high breakdown field strength. For this reason, nitride semiconductors such as GaN are very promising materials for power supply semiconductor devices operated at high voltage and high power.

Many reports have been made on field-effect transistors, particularly, high-electron-mobility transistors (HEMTs), which are examples of semiconductor devices using nitride semiconductors. For example, as GaN-based HEMTs (GaN-HEMTs), HEMTs including AlGaN/GaN have been attracting attention, in which GaN is used as an electron transit layer and AlGaN is used as an electron supply layer. In HEMTs including AlGaN/GaN, distortion occurs in AlGaN due to a difference in lattice constant between GaN and AlGaN. The distortion causes piezoelectric polarization and a spontaneous polarization difference of AlGaN, thereby generating a high-density two-dimensional electron gas (2DEG). Accordingly, it is anticipated that the above-described semiconductor devices using nitride semiconductors would be suitable as high-efficiency switching elements and high breakdown voltage power devices for use in electric vehicles.

[Patent Document 1] Japanese Laid-open Patent Publication No. 2002-359256
[Patent Document 2] Japanese Laid-open Patent Publication No. 2015-12037
[Patent Document 3] Japanese Laid-open Patent Publication No. 2007-173426
[Patent Document 4] Japanese Laid-open Patent Publication No. 2012-234984

SUMMARY

According to an aspect of the embodiments, a semiconductor device includes a substrate; a first semiconductor layer formed above the substrate and including a nitride semiconductor; a second semiconductor layer formed on the first semiconductor layer and including a nitride semiconductor; a gate electrode, a source electrode, and a drain electrode; and a first insulating film and a second insulating film. The gate electrode, the source electrode, and the drain electrode are formed on the second semiconductor layer. The first insulating film is formed on a gate electrode side of the second semiconductor layer and the second insulating film is formed on a drain electrode side of the second semiconductor layer between the gate electrode and the drain electrode. A part of the gate electrode is formed on the first insulating film. The first insulating film and the second insulating film are formed of silicon nitride. A Si—H bond density in the first insulating film is higher than a Si—H bond density in the second insulating film. An N—H bond density in the second insulating film is higher than an N—H bond density in the first insulating film.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 8 is a drawing illustrating a first insulating film and a second insulating film.

DESCRIPTION OF EMBODIMENTS

Figure 1:
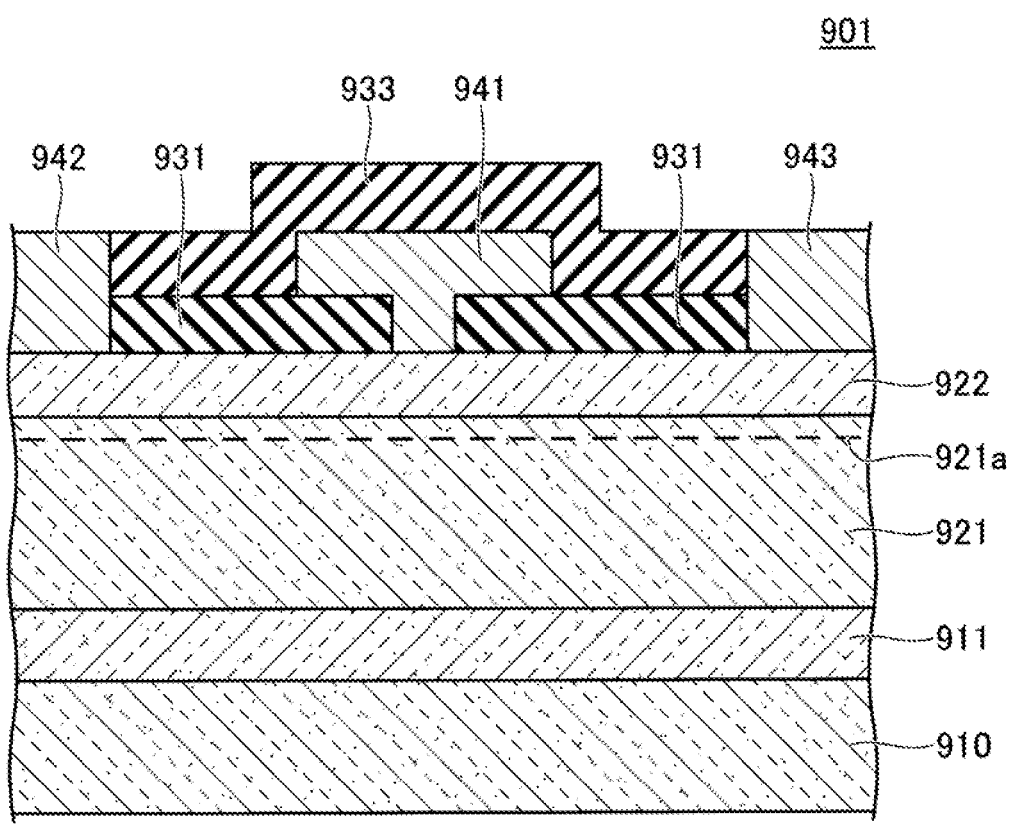
FIG. 1 is a drawing (I) illustrating the structure of a semiconductor device.

In the following, embodiments of the present invention will be described with reference to the accompanying drawings. The same elements are denoted by the same reference numerals and a duplicate description thereof will not be provided.

First Embodiment

First, as an example of a semiconductor device using a nitride semiconductor, a field-effect transistor using a nitride semiconductor will be described. A field-effect transistor 901 illustrated in FIG. 1 is a HEMT in which a nucleation layer (not illustrated), a buffer layer 911, an electron transit layer 921, an electron supply layer 922 are stacked on a substrate 910 in this order. A gate electrode 941, a source electrode 942, and a drain electrode 943 are formed on the electron supply layer 922. An exposed portion of the electron supply layer 922 is covered by an insulating film 931, which serves as a protective film. Further, an insulating film 933 is formed on the insulating film 931 and the gate electrode 941.

In the field-effect transistor 901 illustrated in FIG. 1, which is a semiconductor device, a SiC substrate is used as the substrate 910, and the nucleation layer (not illustrated) is formed of, for example, AlN. The buffer layer 911 is formed of, for example, AlGaN. The electron transit layer 921 is formed of GaN, and the electron supply layer 922 is formed of AlGaN. Accordingly, in the electron transit layer 921, a 2DEG 921a is generated in the vicinity of the interface between the electron transit layer 921 and the electron supply layer 922. The insulating films 931 and 933 are formed of SiN (silicon nitride). The gate electrode 941 is formed of a metal laminated film of a nickel. (Ni) layer that is a lower layer and a gold (Au) layer that is an upper layer. The Ni layer is in contact with the electron supply layer 922. Further, the gate electrode 941 is situated on the insulating film 931 in the vicinity of a region where the gate electrode 941 makes contact with the electron supply layer 922.

In the semiconductor device 901 having the structure as illustrated in FIG. 1, favorable high-frequency characteristics are desired, and a low gate-source capacitance Cgd is thus desired. Specifically, if a depletion layer extends deeply into the electron supply layer 922, the gate-source capacitance Cgd can be reduced, and favorable high-frequency characteristics can be obtained. Note that the gate-source capacitance Cgd is affected not only by the extension of the depletion layer in the region where the gate electrode 941 makes direct contact with the electron supply layer 922, but also by the extension of the depletion layer in the electron supply layer 922 located below the insulating film 931 on which the gate electrode 941 is formed.

The insulating film 931 is a SiN film deposited by chemical vapor deposition (CVD), and is not subjected to heat treatment. In this case, the extension of the depletion layer in the electron supply layer 922 located below the insulating film 931 would be insufficient, and desired high-frequency characteristics would not be obtained. In light of this, the inventor has made earnest investigations and has found that a gate-source capacitance Cgd, which is the capacitance between a gate electrode and a source electrode, can be reduced by utilizing an insulating film that is a SiN film deposited by CVD and is then subjected to heat treatment. Specifically, as in a semiconductor device 902 having a structure illustrated in FIG. 2, the gate-source capacitance Cgd of the semiconductor device can be reduced by using an insulating film 931 that has been subjected to heat treatment after CVD, in place of the insulating film 932.

Figure 2:
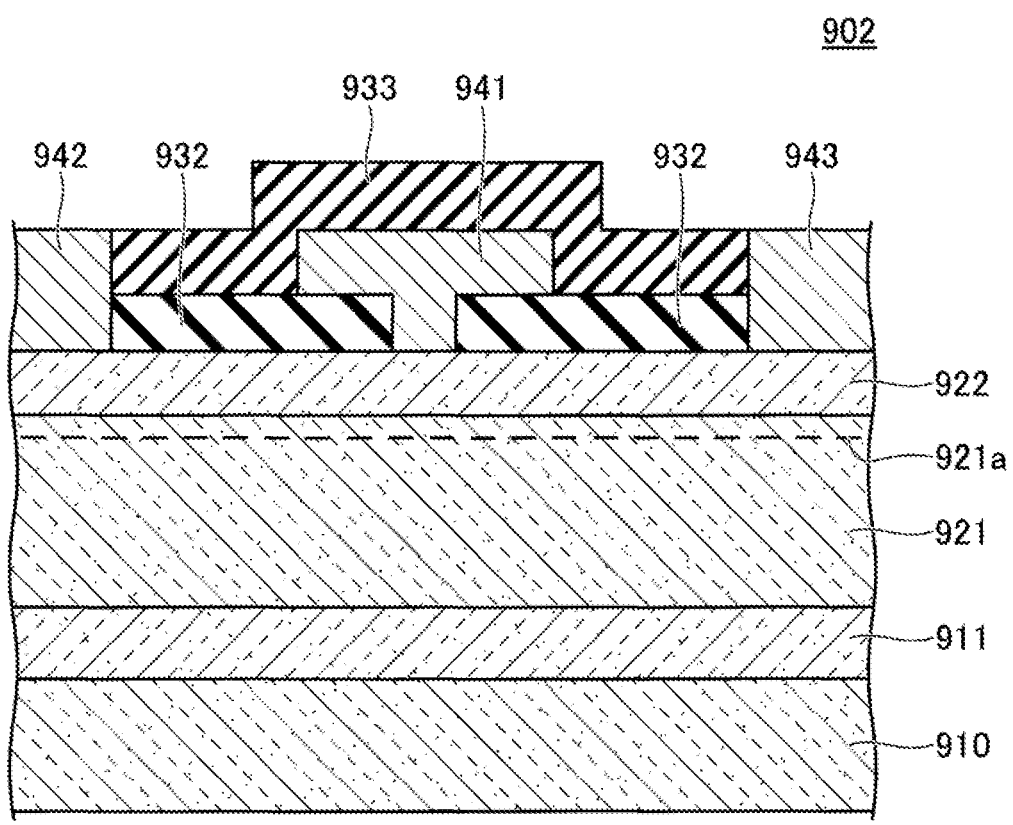
FIG. 2 is a drawing (2) illustrating the structure of a semiconductor device.
Figure 3:
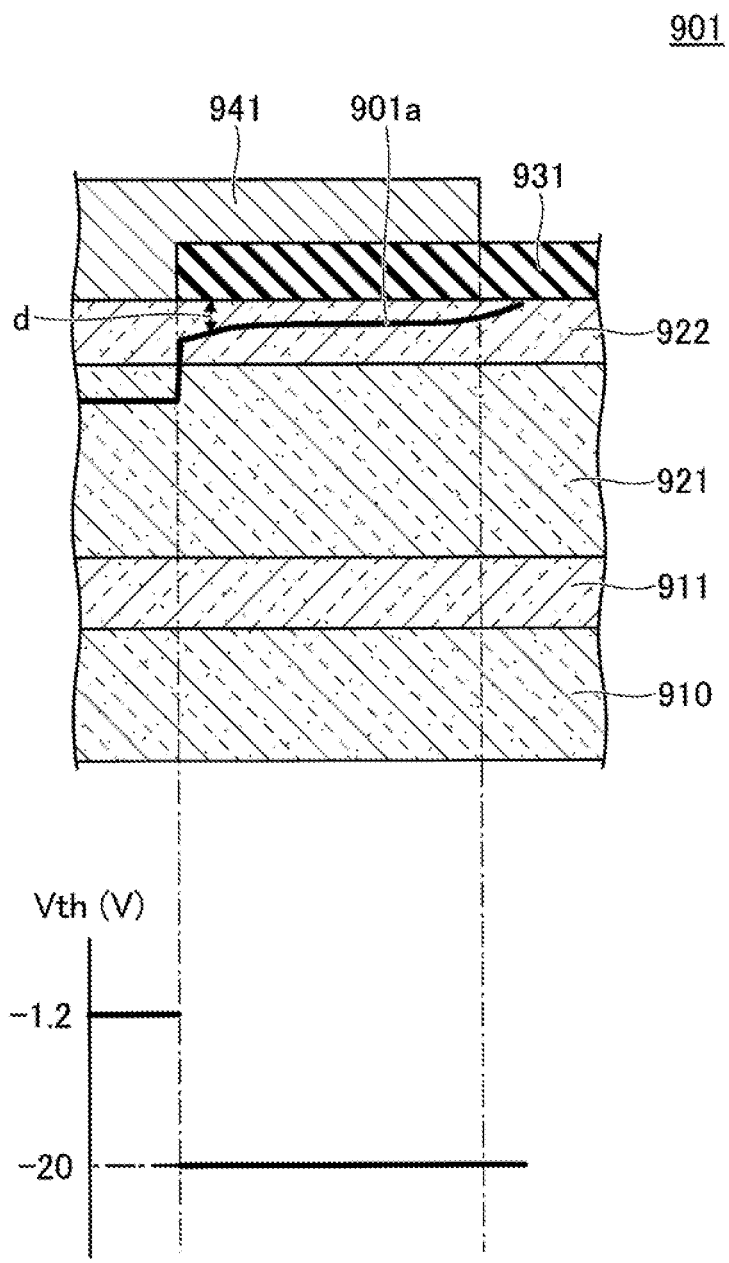
FIG. 3 is a drawing illustrating the semiconductor device having the structure of FIG. 1.
Figure 4:
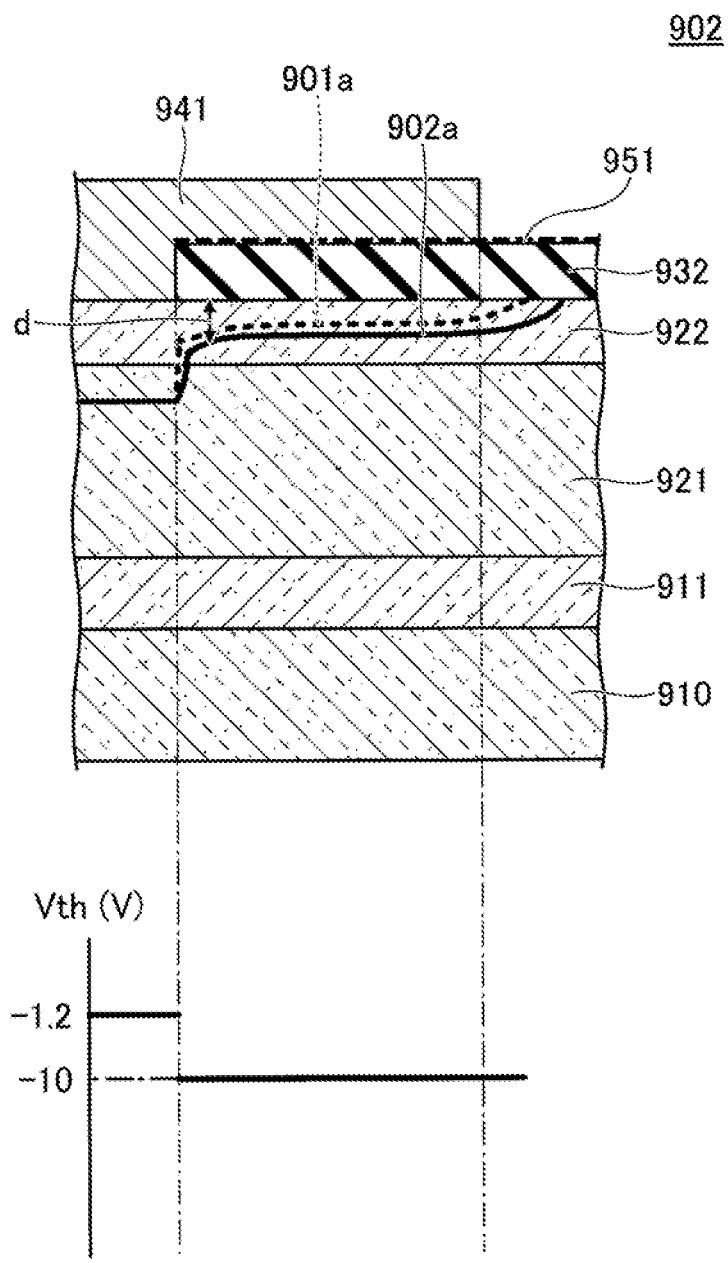
FIG. 4 is a drawing illustrating the semiconductor device having the structure of FIG. 2.

More specifically, in the semiconductor device 901 having the structure illustrated in FIG. 1, a gate threshold voltage Vth of a region where the gate electrode 941 is situated on the insulating film 931 is −20 V, as illustrated in FIG. 3. Conversely, in the semiconductor device 902 having the structure illustrated in FIG. 2, the gate threshold voltage Vth of a region where the gate electrode 941 is situated on the insulating film 932 is −10 V as illustrated in FIG. 4. In each of the semiconductor device 901 having the structure illustrated in FIG. 1 and the semiconductor device 902 having the structure illustrated in FIG. 2, the gate threshold voltage Vth in a region where the gate electrode 941 makes contact with the electron supply layer 922 is −1.2 V.

As described above, by increasing the gate threshold voltage Vth in the region where the gate electrode 941 is situated on the insulating film, the depletion layer can extend deeply into the electron supply layer 922, thereby allowing the gate-source capacitance Cgd to be reduced. Namely, as illustrated in FIG. 3 and FIG. 4, a boundary 902a of the depletion layer in the semiconductor device 902 having the structure illustrated in FIG. 2 extends further than a boundary 901a of the depletion layer having the structure illustrated in FIG. 1.

Figure 5:
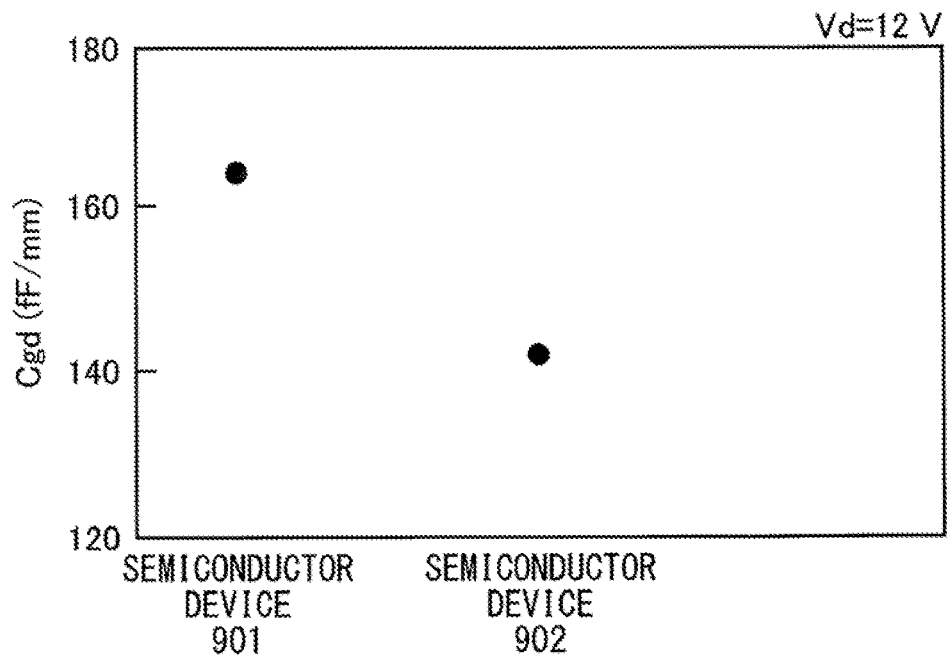
FIG. 5 is a graph (1) illustrating characteristics of the semiconductor devices of FIG. 1 and FIG. 2.

Thus, as illustrated in FIG. 5, while the gate-source capacitance Cgd of the semiconductor device 901 having the structure illustrated in FIG. 1 is approximately 165 fF/mm, the gate-source capacitance Cgd of the semiconductor device 90 having the structure illustrated in FIG. 2 is approximately 142 fF/mm. Note that the above values of the gate-source capacitance Cgd are values obtained when a drain voltage Vd of 12V is applied. Accordingly, the capacitance Cgd can be reduced by using the insulating film 932 in place of the insulating film 931, thereby allowing favorable high-frequency characteristics to be obtained.

The insulating film 932 used in the semiconductor device 902 having the structure illustrated in FIG. 2 is subjected to heat treatment at approximately 700° C. after CVD. After such heat treatment, oxygen 951 is deposited on the surface of the insulating film 932 as illustrated in FIG. 4. Because the gate electrode 941 is formed on the insulating film 932 on which oxygen 951 is deposited, the oxygen 951 is present between the gate electrode 941 and the insulating film 932. When the drain voltage Vd is applied, the oxygen 951 present between the gate electrode 941 and the insulating film 932 functions as an electron trap. As a result, current collapse increases, and on-resistance increases. Such an increase in on-resistance is not preferable.

Figure 6:
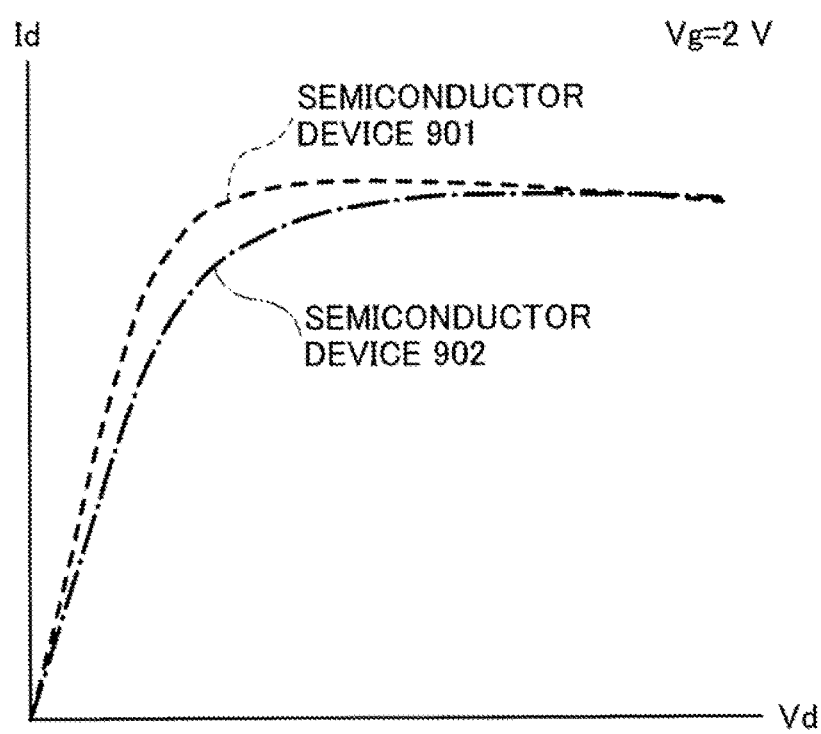
FIG. 6 is a graph (2) illustrating characteristics of the semiconductor devices of FIG. 1 and FIG. 2.

FIG. 6 illustrates a relationship between a drain voltage Vd and a drain current Id (Id-Vd characteristics) in each of the semiconductor device 901 having the structure illustrated in FIG. 1 and the semiconductor device 902 of having the structure illustrated in FIG. 2. Note that a gate voltage Vg is 2 V. As illustrated in FIG. 6, the on-resistance of the semiconductor device 902 having the structure illustrated in FIG. 2 is increased as compared to the semiconductor device 901 having the structure illustrated in FIG. 1, resulting in a slow rising phase of the Id-Vd characteristic curve of the semiconductor device 902. In view of the above, a semiconductor device having favorable high-frequency characteristics and low on-resistance is desired.

(Semiconductor Device)

Figure 7:
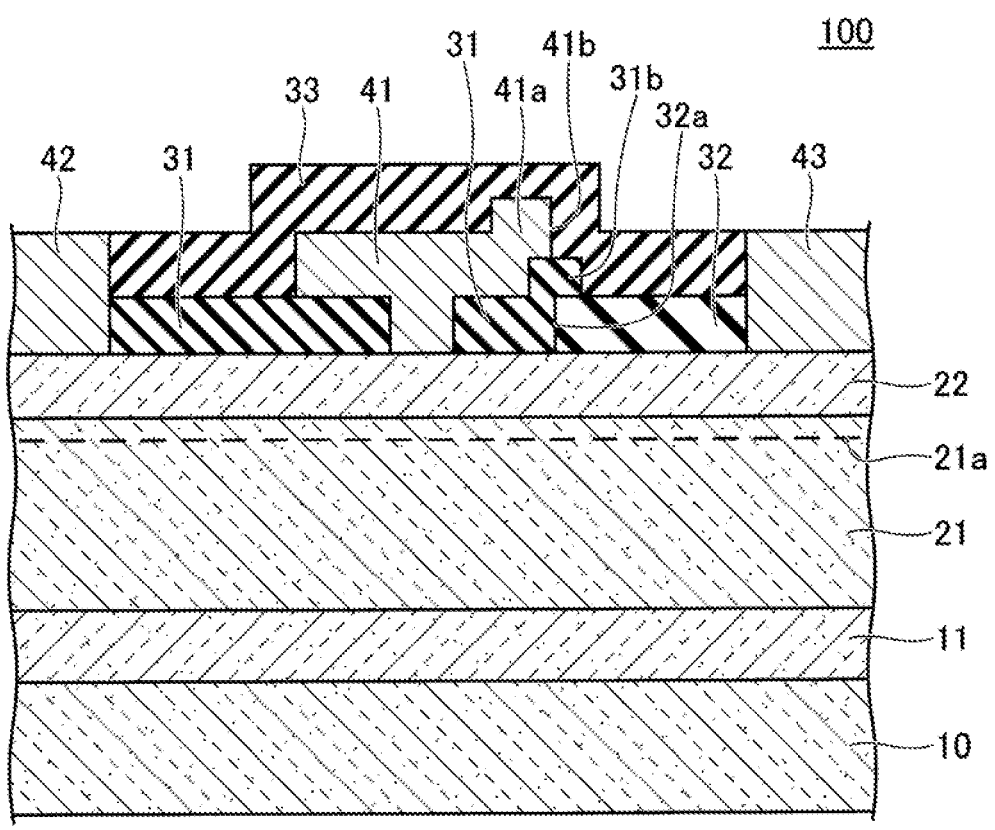
FIG. 7 is a drawing illustrating the structure of a semiconductor device according to a first embodiment.

Next, a semiconductor device according to a first embodiment will be described. As illustrated in FIG. 7, a semiconductor device 100 according to the first embodiment is a HEMT in which a nucleation layer (not illustrated), a buffer layer 11, an electron transit layer 21, an electron supply layer 22 are stacked on a substrate 10 in this order. A gate electrode 41, a source electrode 42, and a drain electrode 43 are formed on the electron supply layer 22. A first insulating film 31 is formed on the electron supply layer 22 between the source electrode 42 and the gate electrode 41 and also between the gate electrode 41 and the drain electrode 43. A second insulating film 32 is formed on the electron supply layer 22 between the gate electrode 41 and the drain electrode 43. The first insulating film 31 is formed on the gate electrode 41 side and the second insulating film 32 is formed on the drain electrode 43 side of the electron supply layer 22 between the gate electrode 41 and the drain electrode 43. The gate electrode 41 is formed such that a portion 41a of the gate electrode 41 is situated on the first insulating film 31 in the vicinity of a region where the gate electrode 41 makes contact with the electron supply layer 22. Further, a third insulating film 33 is formed on the first insulating film 31, the second insulating film 32, and the gate electrode 41.

In the present embodiment, a portion 31b of the first insulating film 31 is situated on an end portion 32a on the gate electrode 41 side of the second insulating film 32, and the portion 41a of the gate electrode 41 is situated on one side of the portion 31b of the first insulating film 31. Further, the end portion 41b on the drain electrode 43 side of the gate electrode 41 preferably coincides with the end portion 32a on the gate electrode 41 side of the second insulating film 32, when viewed in a direction normal to the surface of the substrate 10. However, the portion 41a of the electrode 41 may extend to the other side of the portion 31b of the first insulating film 31 that is situated on the end portion 32a on the gate electrode 41 side of the second insulating film 32. Namely, the end portion 41b on drain electrode 43 side of the gate electrode 41 may be located on the drain electrode 43 side relative to the end portion 32a on the gate electrode 41 side of the drain electrode 43.

In the semiconductor device according to the present embodiment, a SiC substrate is used as the substrate 10, and the nucleation layer (not illustrated) is formed of, for example, AlN. The buffer layer 11 is formed of, for example, AlGaN. The electron transit layer 21 is formed of GaN, and the electron supply layer 22 is formed of AlGaN. Accordingly, in the electron transit layer 21, a 2DEG 21a is generated in the vicinity of the interface between the electron transit layer 21 and the electron supply layer 22. The first insulating film 31, the second insulating film 32, and the third insulating film 33 are formed of, for example, SiN. The gate electrode 41 is formed of a metal laminated film of a Ni layer, which is a lower layer, and an Au layer, which is an upper layer. The first insulating film 31 is a SiN film that is deposited by CVD, but is not subjected to heat treatment. The second insulating film 32 is a SiN film that is deposited by CVD and is then subjected to heat treatment at approximately 700° C. Note that, when a SiN film is subjected to heat treatment, the Si—H bond density and the N—H bond density of the SiN film change.

Specifically, as illustrated in FIG. 8, the Si—H bond density of the first insulating film 31 is $1.0\times10^{22}/cm^3$, and the N—H bond density of the first insulating film 31 is $1.0\times10^{21}/cm^3$. The second insulating film 32 is obtained by conducting heat treatment on the first insulating film 31 at 700° C. The Si—H bond density of the second insulating film 32 is $1.0\times10^{21}/cm^3$, and the N—H bond density of the second insulating film 32 is $1.0\times10^{22}/cm^3$. As compared to the first insulating film 31, the Si—H bond density of the second insulating film 32 is decreased, and the N—H bond density of the second insulating film 32 is increased. Values of the Si—H bond density and of the N—H bond density are measured by X-ray photoelectron spectroscopy (XPS). For light with a wavelength λ of 633 nm, the first insulating film 31 has a refractive index of 2.05, while the second insulating film 32 has a refractive index of 1.90.

Specifically, the Si—H bond density of the first insulating film 31 is greater than or equal to $1.0\times10^{22}/cm^3$, and the Si—H bond density of the second insulating film 32 is less than $1.0\times10^{22}/cm^3$. Accordingly, the Si—H bond density of the first insulating film 31 is higher than that of the second insulating film 32.

Further, the N—H bond density of the first insulating film 31 is less than $1.0\times10^{22}/cm^3$, the N—H bond density of the second insulating film 32 is greater than or equal to $1.0\times10^{22}/cm^3$. Accordingly, the N—H bond density of the first insulating film 31 is lower than that of the second insulating film 32.

Figure 9:
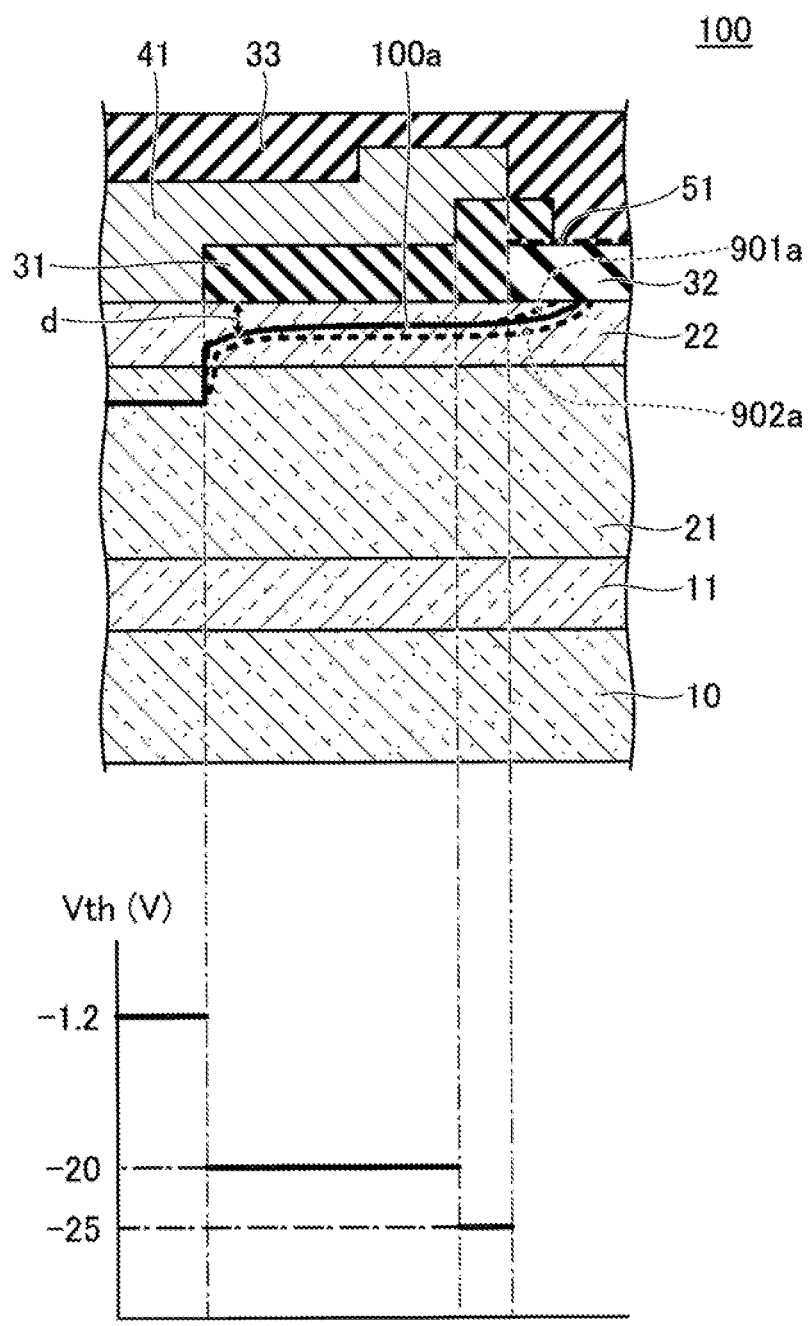
FIG. 9 is a drawing illustrating the semiconductor device according to the first embodiment.

As illustrated in FIG. 9, in the semiconductor device according to the present embodiment, the gate threshold voltage Vth in the region where the gate electrode 41 is situated on the first insulating film 31 is −20 V. Further, the second insulating film 32 is formed on the drain electrode 43 side of the electron supply layer 22 between the gate electrode 41 and the drain electrode 43. As described above, by forming the second insulating film 32 on the drain electrode 43 side, a depletion layer can extend to the drain electrode 43 side in the electron supply layer 22, as illustrated in FIG. 9. Accordingly, the gate-drain capacitance Cgd can be reduced.

In FIG. 9, the boundary 901a of the depletion layer of the semiconductor device 901 having the structure of FIG. 1 is indicated by a dashed line, the boundary 902a of the depletion layer of the semiconductor device 902 having the structure of FIG. 2 is indicated by a dashed line, a boundary 100a of the depletion layer of the semiconductor device according to the present embodiment is indicated by a continuous line. Note that the gate threshold voltage Vth in the region where the gate electrode 41 makes contact with the electron supply layer 22 is −1.2 V.

Further, in the semiconductor device according to the present; embodiment, although oxygen 51 is deposited on the surface of the second insulating film 32 by heat treatment, the first insulating film 31 and the third insulating film 33 are formed on the second insulating film 32. Accordingly, even when a drain voltage is applied, electrons are not be trapped by oxygen deposited on the surface of the second insulating film 32, thereby suppressing the occurrence of current collapse.

Figure 10:
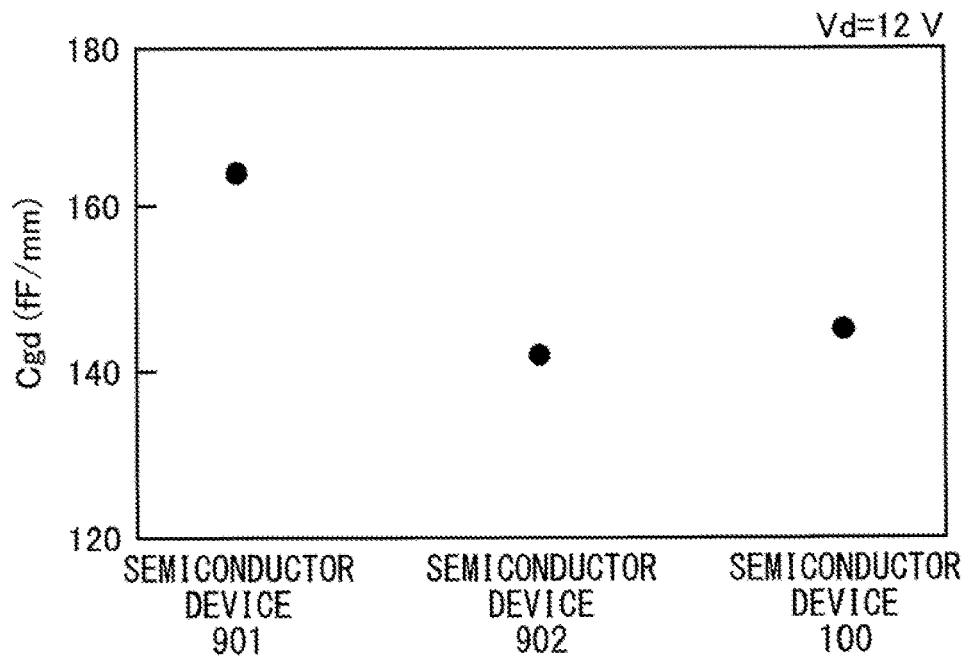
FIG. 10 is a graph (1) illustrating characteristics of the semiconductor device according to the first embodiment.
Figure 11:
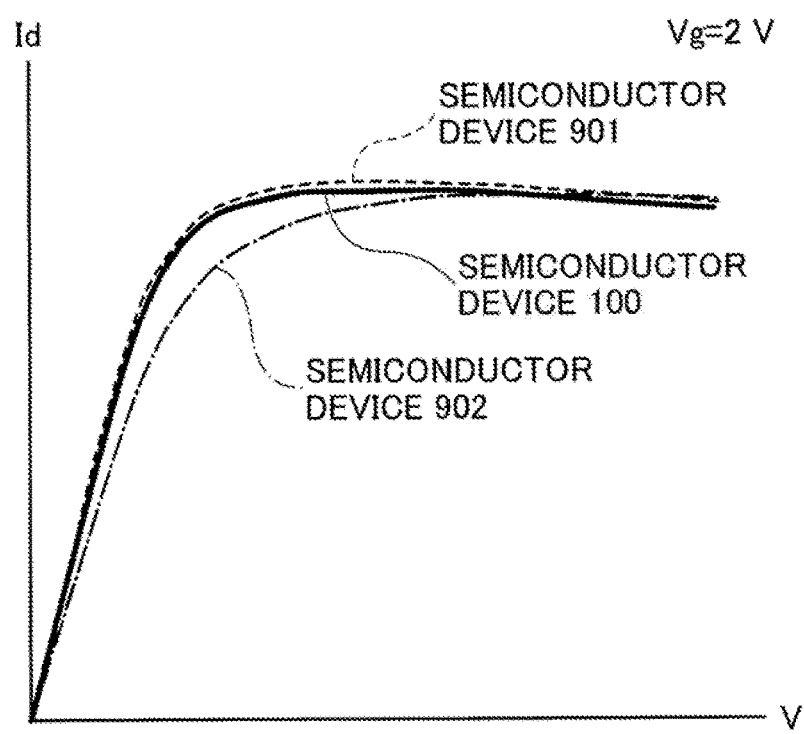
FIG. 11 is a graph (2) illustrating characteristics of the semiconductor device according to the first embodiment.

Accordingly, as illustrated in FIG. 10, the gate-source capacitance Cgd of the semiconductor device 100 according to the first embodiment can be reduced as compared to that of the semiconductor device 901, and can become close to that of the semiconductor device 902. Therefore, favorable high-frequency characteristics can be obtained. In addition, in the semiconductor device 100 according to the first embodiment, the occurrence of current collapse can be suppressed, and on-resistance can be reduced. Therefore, favorable Id-Vd characteristics close to those of the semiconductor device 901 as illustrated in FIG. 11 can be obtained.

Figure 12:
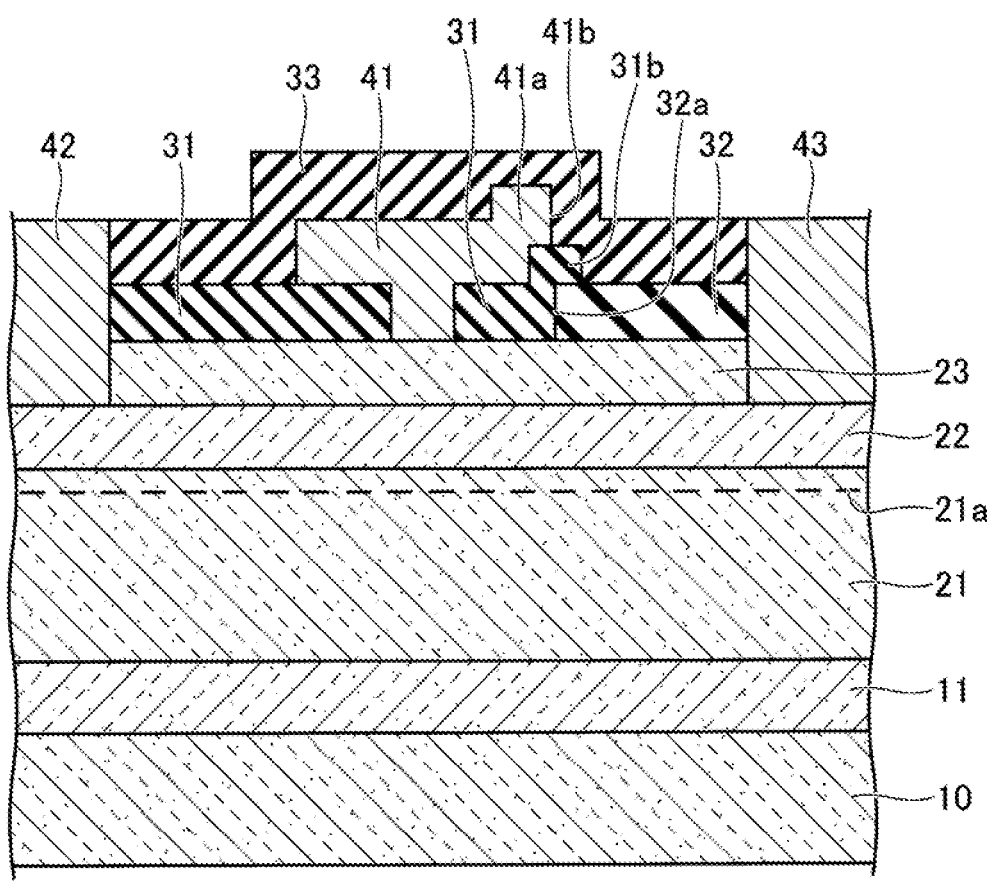
FIG. 12 is a drawing illustrating a variation of the semiconductor device according to the first embodiment.

The semiconductor device according to the first embodiment may also include a cap layer 23 formed on the electron supply layer 22, as illustrated in FIG. 12. In this case, the cap layer 23 is formed of GaN with a thickness of 5 nm, and the first insulating film 31, the second insulating film 32, and the gate electrode 41 are formed on the cap layer 23. Further, the source electrode 42 and the drain electrode 43 are formed on the electron supply layer 22 from which the cap layer 23 is removed.

In the semiconductor device according to the present embodiment, the electron supply layer 22 may be formed of InAlN or InAlGaN.

(Method for Producing Semiconductor Device)

Next, a method for producing the semiconductor device according to the present embodiment will be described with reference to FIG. 13A through FIG. 17B. Note that a nitride semiconductor layer is epitaxially grown on the substrate 10 by metal-organic vapor phase epitaxy (MOVPE). When the nitride semiconductor layer is grown by MOVPE, trimethylaluminum (TMA) is used as a raw material gas of Al, trimethylgallium (TMG) is used as a raw material gas of Ga, and ammonia (NH3) is used as a raw material gas of N. Further, when the nitride semiconductor layer is doped with Fe, cyclopentadienyliron (CP$_2$Fe) is supplied as a raw material gas. Note that the nitride semiconductor layer may be formed by molecular-beam epitaxy (MBE).

Figure 13A:
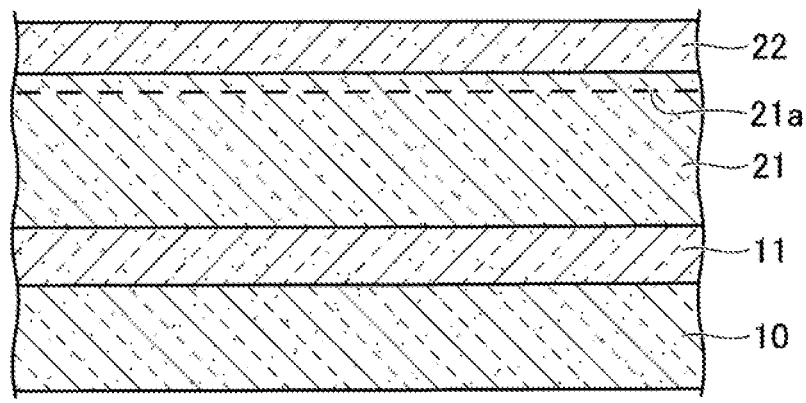
FIG. 13A is a drawing (1) illustrating a method for producing the semiconductor device according to the first embodiment.

First, as illustrated in FIG. 13A, the nucleation layer (not illustrated), the buffer layer 11, the electron transit layer 21, and the electron supply layer 22 are formed on the substrate 10 in this order by MOVPE. In the present embodiment, a SiC substrate is used as the substrate 10. The nucleation layer (not illustrated) is formed of AlN with a thickness of 1 nm to 300 nm, for example, a thickness of 160 nm. The buffer layer 11 is formed of AlGaN with a thickness of 1 nm to 1000 nm, for example, a thickness of 600 nm. The electron transit layer 21 is formed of i-GaN with a thickness of approximately 3.0 μm. The electron supply layer 22 is formed of n-AlGaN with a thickness of approximately 30 nm, and is doped with Si as an impurity element imparting n-type at a concentration of approximately $5\times10^{18}$ cm$^{-3}$. Accordingly, the 2DEG 21a is generated in the vicinity of the interface between the electron transit layer 21 and the electron supply layer 22. Note that a spacer layer (not illustrated) formed of i-AlGaN with a thickness of 5 nm may be formed between the electron transit layer 21 and the electron supply layer 22.

Figure 13B:
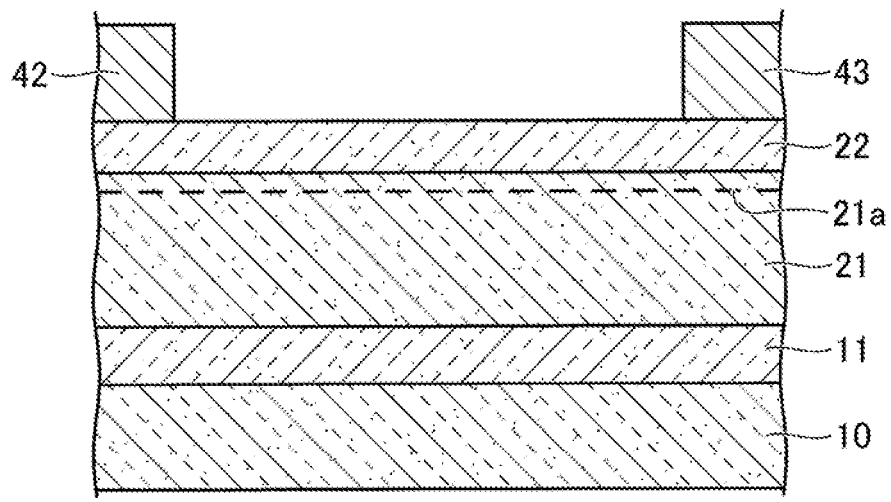
FIG. 13B is a drawing (2) illustrating the method for producing the semiconductor device according to the first embodiment.

Next, as illustrated in FIG. 13B, the source electrode 42 and the drain electrode 43 are formed on the electron supply layer 22. Specifically, a photoresist is applied to the electron supply layer 22, and light exposure and development are performed by a light exposure device to thereby form a resist pattern (not illustrated) having openings in regions where the source electrode 42 and the drain electrode 43 are to be formed. Subsequently, a metal laminated film is formed by depositing a Ta film and a Al film by vacuum deposition, and is then immersed in an organic solvent, such that the metal laminated film formed on the resist pattern is removed by lift-off together with the resist pattern. As a result, the source electrode 42 and the drain electrode 43 are formed by the metal laminated film remaining on the electron supply layer 22. The Ta film of the metal laminated film has a thickness of, for example, 7 nm. Subsequently, heat treatment is performed at a temperature of 400° C. to 900° C., for example, at a temperature of 580° C. in an atmosphere of nitrogen, such that an ohmic contact is formed between the source electrode 42 and the drain electrode 43.

Figure 14A:
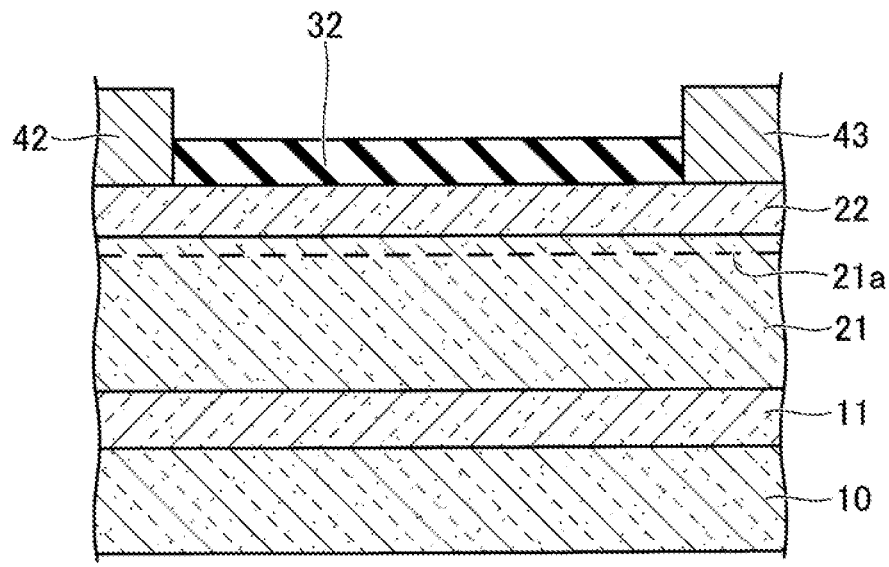
FIG. 14A is a drawing (3) illustrating the method for producing the semiconductor device according to the first embodiment.

Next, as illustrated in FIG. 14A, the second insulating film 32 is formed on an exposed part of the electron supply layer 22. Specifically, SiN is deposited to a thickness of 100 nm on the electron supply layer 22 by CVD, and heat treatment is performed at 700° C. As a result, the second insulating film 32 is formed.

Figure 14B:
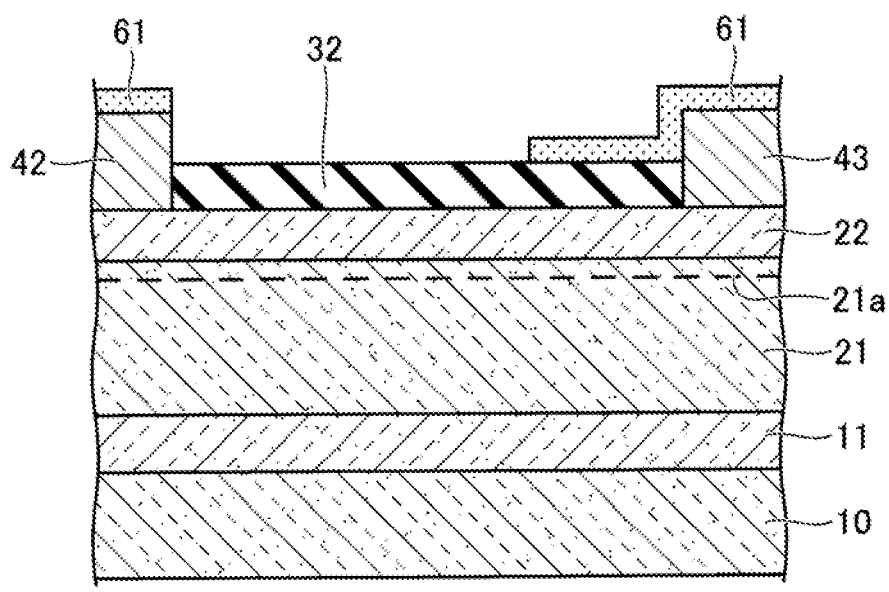
FIG. 14B is a drawing (4) illustrating the method for producing the semiconductor device according to the first embodiment.

Next, as illustrated in FIG. 14B, a resist pattern 61 is formed on a part of the second insulating film 32 on the drain electrode 43, the source electrode 42, and the drain electrode 43. Specifically, a photoresist is applied to the part of the second insulating film 32, the source electrode 42, and the drain electrode 43, and light exposure and development are performed to thereby form the resist pattern 61.

Figure 15A:
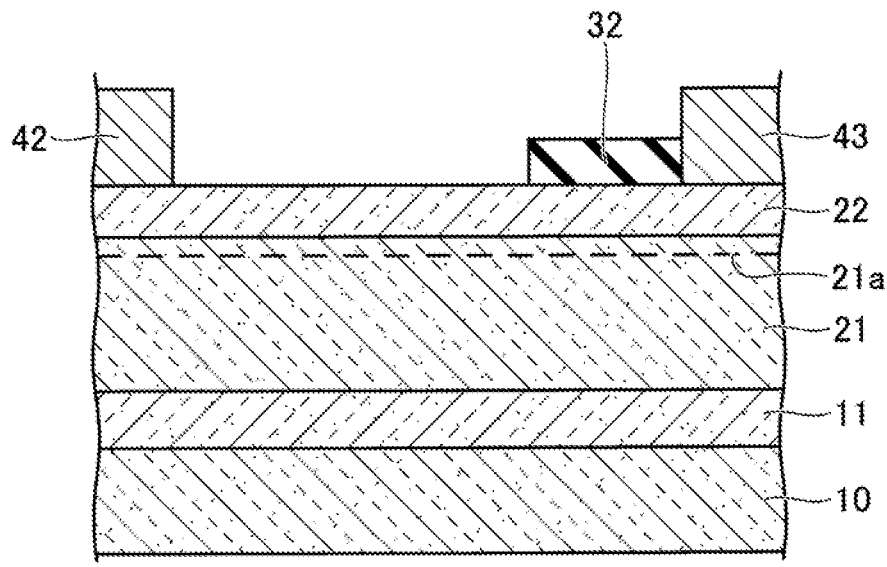
FIG. 15A is a drawing (5) illustrating the method for producing the semiconductor device according to the first embodiment.

Next, as illustrated in FIG. 15A, the remainder of the second insulating film 32, where the resist pattern 61 is not formed, is removed by dry etching, such as reactive ion etching (RIE), and a part of the electron supply layer 22 is exposed. Subsequently, the resist pattern 61 is removed by an organic solvent, for example.

Figure 15B:
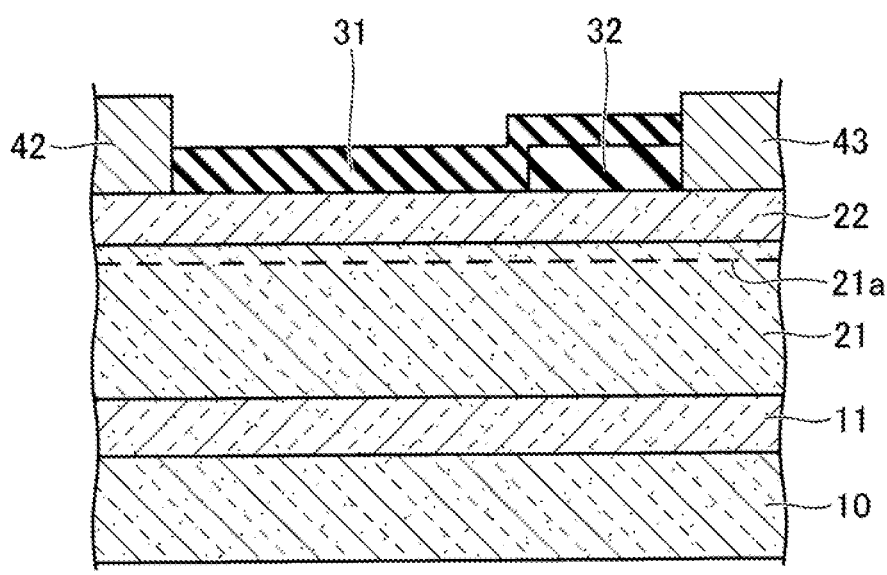
FIG. 15B is a drawing (6) illustrating the method for producing the semiconductor device according to the first embodiment.

Next, as illustrated in FIG. 15B, the first insulating film 31 is formed on the exposed part of the electron supply layer 22 and the second insulating film 32. Specifically, SiN is deposited to a thickness of 100 nm on the exposed part of the electron supply layer 22 and the second insulating film 32 by CVD, such that the first insulating film 31 is formed. The first insulating film 31 is not subjected to heat treatment after CVD.

Figure 16A:
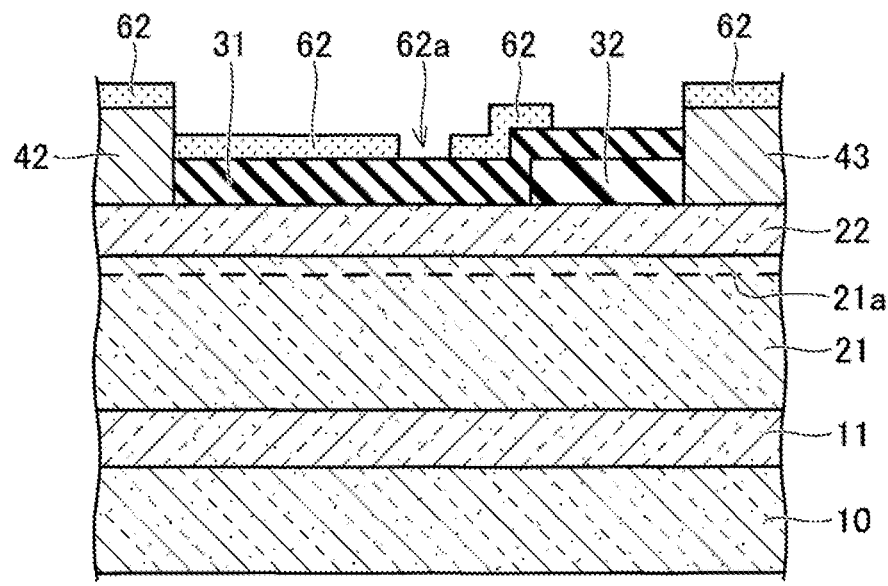
FIG. 16A is a drawing (7) illustrating the method for producing the semiconductor device according to the first embodiment.

Next, as illustrated in FIG. 16A, a resist pattern 62, having an opening in a region where the gate electrode 41 is to be formed, is formed on a part of the first insulating film 31. Specifically, a photoresist is applied to the first insulating film 31, the source electrode 42, and the drain electrode 43, and light exposure and development are performed to thereby form the resist pattern 62.

Figure 16B:
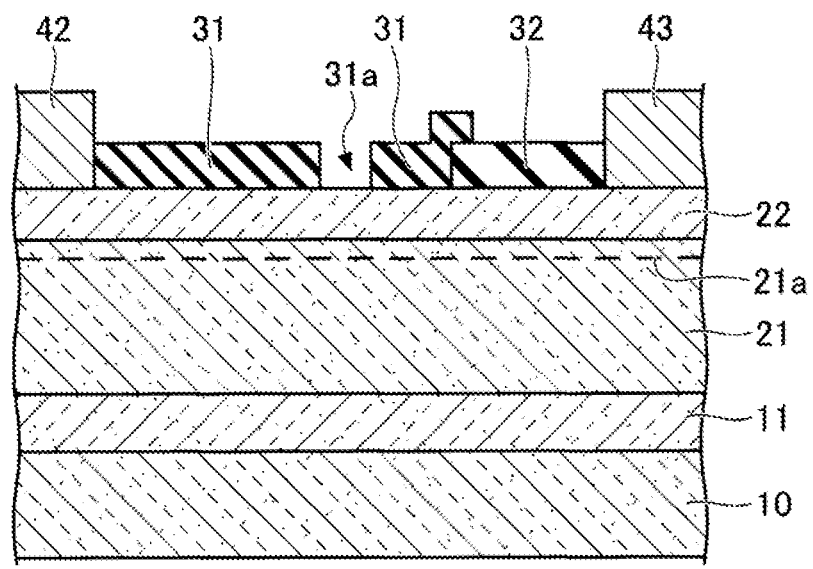
FIG. 16B is a drawing (8) illustrating the method for producing the semiconductor device according to the first embodiment.

Next, as illustrated in FIG. 16B, a part of the first insulating film 31, where the opening 62a of the resist pattern 62 is formed, is removed by dry etching, such as RIE. Further, the resist pattern 62 is removed by an organic solvent. As a result, an opening 31a, through which the electron supply layer 22 is exposed, is formed in the first insulating film 31.

Figure 17A:
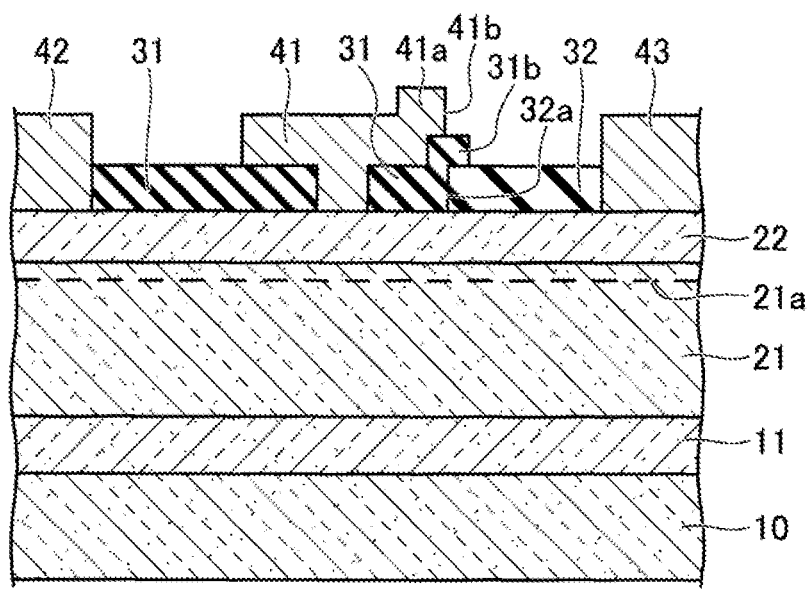
FIG. 17A is a drawing (9) illustrating the method for producing the semiconductor device according to the first embodiment.

Next, as illustrated in FIG. 17A, the gate electrode 41 is formed on the electron supply layer 22 exposed through the opening 31a, and is also formed on the first insulating film 31 around the opening 31a. Specifically, a photoresist is applied to the first insulating film 31, the source electrode 42, and the drain electrode 43, and light exposure and development are performed to thereby form a resist pattern (not illustrated) having an opening in the region where the gate electrode 41 is to be formed. Subsequently, a metal laminated film is formed by depositing a Ni film and an Au film by vacuum deposition, and is then immersed in an organic solvent, such that the metal laminated film formed on the resist pattern is removed by lift-off together with the resist pattern. As a result, the gate electrode 41 is formed by the remaining metal laminated film. The gate electrode 41 is formed not only on the electron supply layer 22 exposed through the opening 31a of the first insulating film 31, but also on the first insulating film 31 around the opening 31a.

Figure 17B:
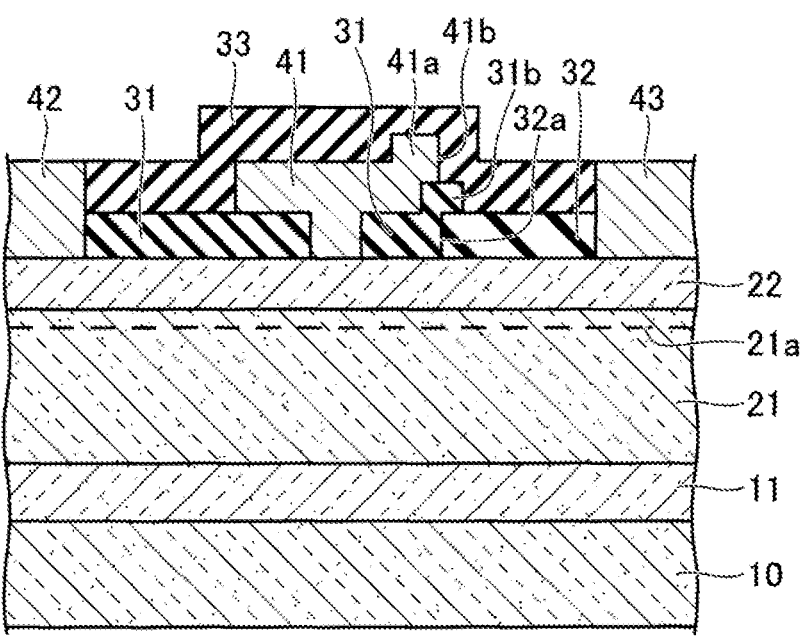
FIG. 17B is a drawing (10) illustrating the method for producing the semiconductor device according to the first embodiment.

Next, as illustrated in FIG. 17B, the third insulating film 33 is formed on the gate electrode 41, the first insulating film 31, and the second insulating film 32. Specifically, a SiN film with a thickness of 100 nm is deposited on the gate electrode 41, the first insulating film 31, and the second insulating film 32 by CVD, thereby forming the third insulating film 33. The third insulating film 33 may be formed under the same conditions as the first insulating film 31, or may be formed under the same conditions as the second insulating film 32. Preferably, the third insulating film 33 is formed under the same conditions as the first insulating film 31 in which heat treatment is not performed.

The semiconductor device according to the present embodiment can be produced by the above-described method.

Second Embodiment

Figure 18:
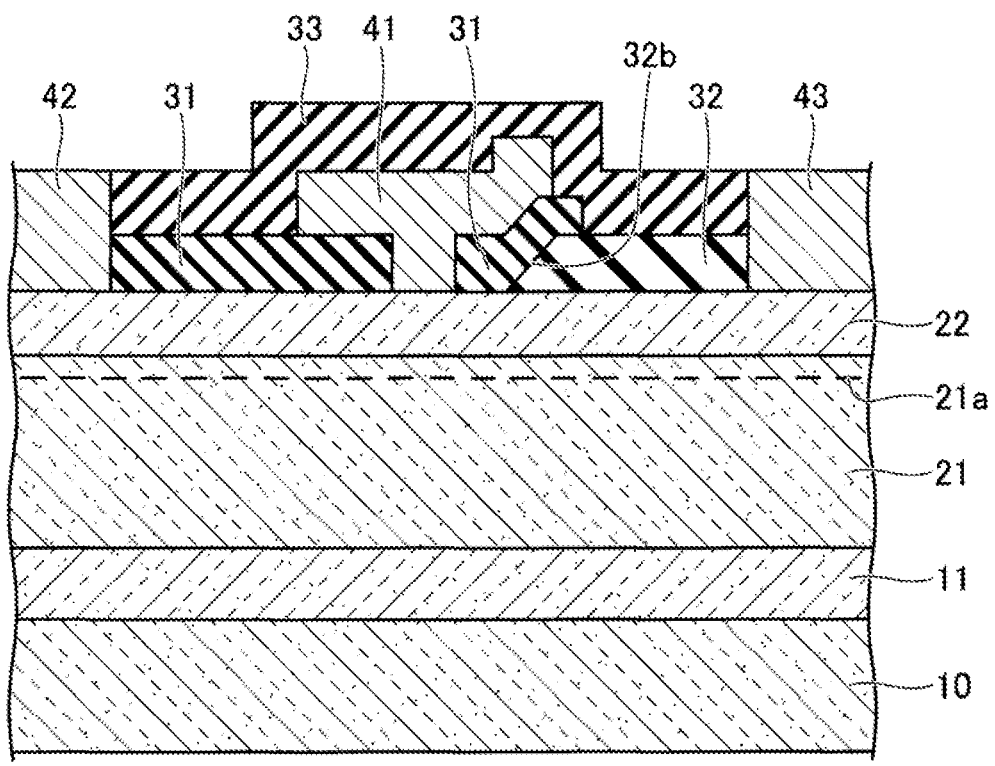
FIG. 18 is a drawing illustrating the structure of a semiconductor device according to a second embodiment.

Next, a semiconductor device according to a second embodiment will be described. As illustrated in FIG. 18, the semiconductor device according to the second embodiment has a structure in which an end portion 32b on the gate electrode 41 side of the second insulating film 32 is inclined with respect to a direction normal to the surface of the substrate 10. Specifically, the end portion 32b on the gate electrode 41 side of the second insulating film 32 is inclined such that an angle formed by the end portion 32b with the surface of the substrate 10 is an acute angle. In this manner, by inclining the end portion 32b on the gate electrode 41 side of the second insulating film 32 with respect to the direction normal to the surface of the substrate 10, the electric field concentration can be relaxed and suppressed.

The details other than the above are the same as those of the first embodiment.

Third Embodiment

Figure 19:
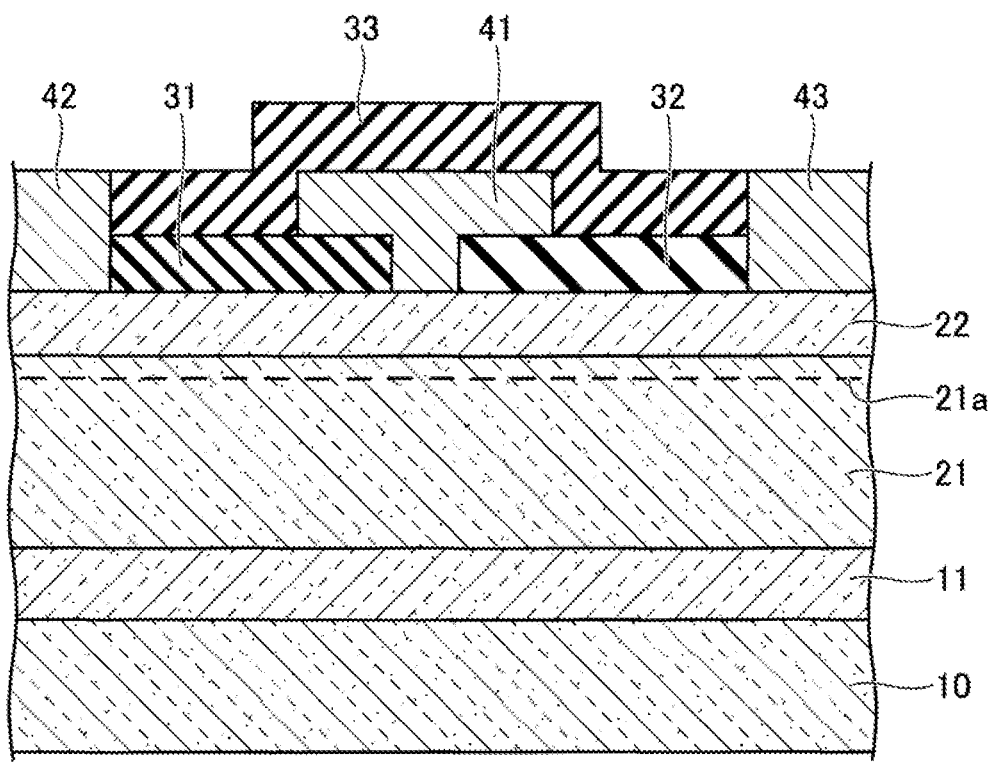
FIG. 19 is a drawing illustrating the structure of a semiconductor device according to a third embodiment.

Next, a semiconductor device according to a third embodiment will be described. As illustrated in FIG. 19, in the semiconductor device according to the third embodiment, the first insulating film 31 is formed on the electron supply layer 22 between the source electrode 42 and the gate electrode 41, and the second insulating film 32 is formed on the electron supply layer 22 between the drain electrode 43 and the gate electrode 41. The gate electrode 41 is formed in contact with a region of the electron supply layer 22, and is also formed on the first insulating film 31 and the second insulating film 32 around the region where the gate electrode 41 contacts the electron supply layer 22. A depletion layer extends deeper in a region of the first insulating film 31 on which the gate electrode 41 is formed than in a region of the second insulating film 32 on which the gate electrode 41 is formed. Therefore, by forming the second insulating film 32 between the gate electrode 41 and the drain electrode 43 rather than the first insulating film 31, a gate-drain breakdown voltage can be improved The details other than the above are the same as those of the first embodiment.

Fourth Embodiment

Next, a fourth embodiment will be described. In the fourth embodiment, a semiconductor device, a power supply device, and a high-frequency amplifier will be described.

Figure 20:
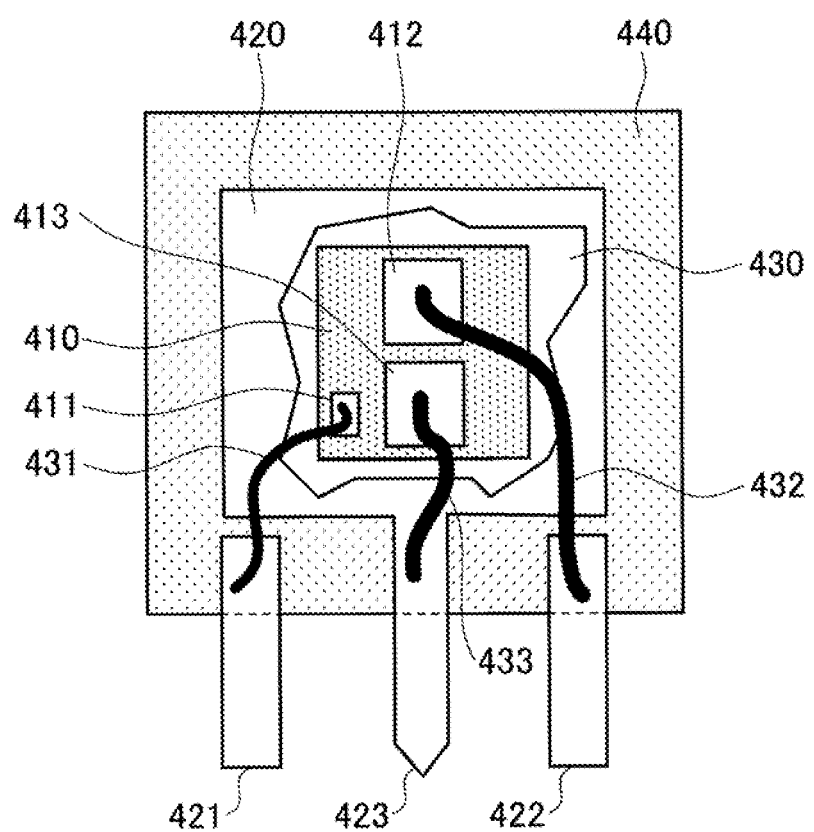
FIG. 20 is a drawing illustrating a discretely packaged semiconductor device according to a fourth embodiment.

The semiconductor device according to the sixth embodiment is produced by discretely packaging any of the semiconductor devices according to the first to third embodiments. Such a discretely packaged semiconductor device will be described with reference to FIG. 20. Note that FIG. 20 schematically depicts the inside of the discretely packaged semiconductor device, and the arrangement of electrodes and the like are different from those of the first to third embodiments.

First, a semiconductor device produced according to any one of the first to third embodiments is cut by dicing, and a HEMT semiconductor chip 410 is formed by using a GaN-based semiconductor material. The semiconductor chip 410 is fixed on a lead frame 420 via a die attach agent 430 such as solder. The semiconductor chip 410 corresponds to any one of the semiconductor devices according to the first to third embodiments.

Next, a gate electrode 411 is connected to a gate lead 421 via a bonding wire 431, a source electrode 412 is connected to a source lead 422 via a bonding wire 432, and a drain electrode 413 is connected to a drain lead 423 via a bonding wire 433. The bonding wires 431, 432, and 433 are made of a metallic material such as Al. Further, in the fourth embodiment, the gate electrode 411 is a gate electrode pad, and is connected to the gate electrode 41 of a semiconductor device according to any one of the first to third embodiments. The source electrode 412 is a source electrode pad, and is connected to the source electrode 42 of the semiconductor device according to any one of the first to third embodiments. The drain electrode 413 is a drain electrode pad, and is connected to the drain electrode 43 of the semiconductor device according to any one of the first to third embodiments.

Next, the semiconductor chip 41 is sealed with a mold resin 440 by a transfer molding method. Accordingly, the discretely packaged HEMT semiconductor device can be produced by using the GaN-based semiconductor material.

Next, the power supply device and the high-frequency amplifier according to the fourth embodiment will be described. The power supply device and the high-frequency amplifier according to the fourth embodiment use semiconductor devices according to any one of the first to third embodiments.

Figure 21:
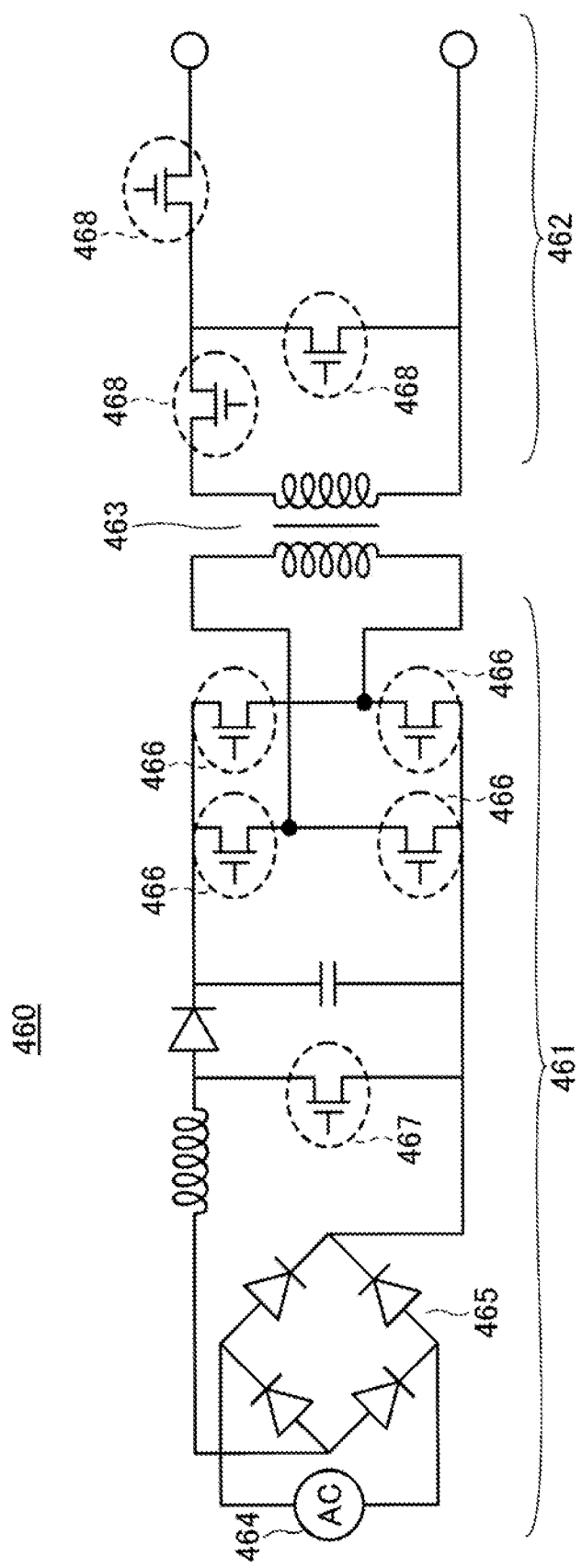
FIG. 21 a circuit diagram of a power supply device according to the fourth embodiment.

First, a power supply device 460 according to the fourth embodiment will be described with reference to FIG. 21. The power supply device 460 according to the fourth embodiment includes a high-voltage primary circuit 461, a low-voltage secondary circuit 462, and a transformer 463 disposed between the primary circuit 461 and the secondary circuit 462. The primary circuit 461 includes an alternator 464, a bridge rectifier circuit 465, a plurality of (in the example of FIG. 21, four) switching elements 466, and one switching element 467. The secondary circuit 462 includes a plurality of (in the example of FIG. 21, three) switching elements 468. In the example of FIG. 21, the semiconductor devices according to any one of the first to third embodiments may be used as the switching elements 466 and 467 of the primary circuit 461. Note that the switching elements 466 and 467 of the primary circuit 461 are preferably "normally off" semiconductor devices. The switching elements 468 of the secondary circuit 462 may be ordinary metal insulator semiconductor field effect transistors (MISFET) formed of silicon.

Figure 22:
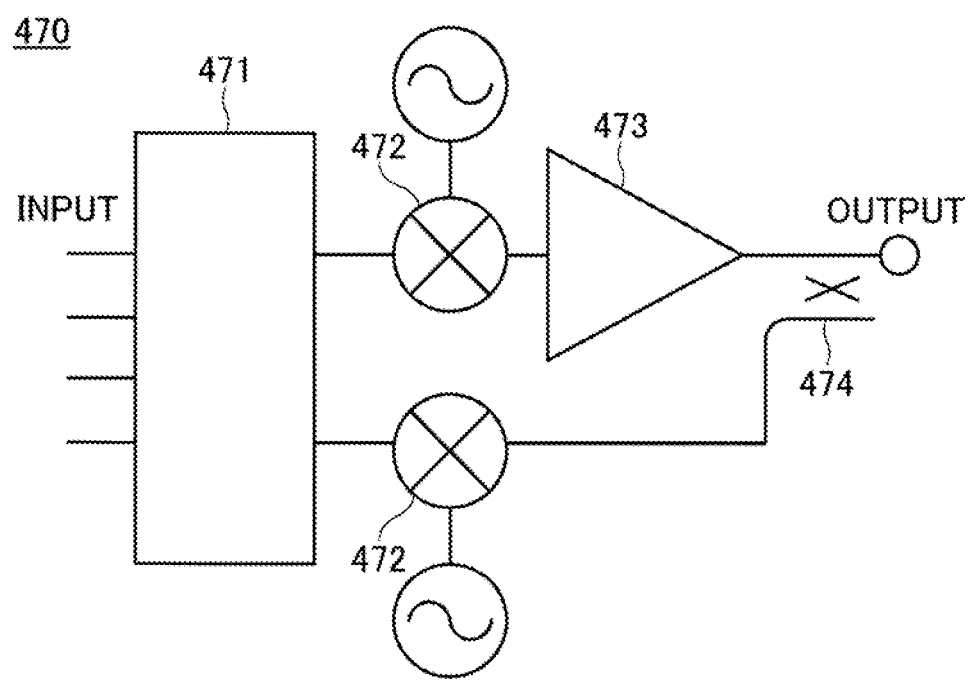
FIG. 22 is a drawing illustrating the structure of a high-frequency amplifier according to the fourth embodiment.

Next, a high-frequency amplifier 470 according to the fourth embodiment will be described with reference to FIG. 22. The high-frequency amplifier 470 according to the fourth embodiment may be applied to a power amplifier for a mobile phone base station, for example. The high-frequency amplifier 470 includes a digital predistortion circuit 471, mixers 472, a power amplifier 473, and a directional coupler 474. The digital predistortion circuit 471 compensates for nonlinear distortion of an input signal. The mixers 472 mix the input signal, whose nonlinear distortion is compensated for, with an alternating current (AC) signal. The power amplifier 473 amplifies the input signal mixed with the AC signal. In the example illustrated in FIG. 22, the power amplifier 473 includes a semiconductor device according to any one of the first to third embodiments. The directional coupler 474 monitors input signals and output signals. In the circuit illustrated in FIG. 22, the mixers 472 may mix an output signal with an AC signal by turning on or off a switch, and the mixed signal may be sent to the digital predistortion circuit 471.

According to at least one embodiment, a semiconductor device having favorable high-frequency characteristics and low on-resistance is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. A semiconductor device comprising:
   a substrate;
   a first semiconductor layer formed above the substrate and including a nitride semiconductor;
   a second semiconductor layer formed on the first semiconductor layer and including a nitride semiconductor;
   a gate electrode, a source electrode, and a drain electrode, the gate electrode, the source electrode, and the drain electrode being formed on the second semiconductor layer; and
   a first insulating film and a second insulating film both formed on the second semiconductor layer, closest point of the second insulating film to the source electrode being situated between the first insulating film and the drain electrode,
   a part of the gate electrode is formed on the first insulating film,
   the first insulating film and the second insulating film are formed of silicon nitride,
   a Si—H bond density in the first insulating film is higher than a Si—H bond density in the second insulating film, and
   an N—H bond density in the second insulating film is higher than an N—H bond density in the first insulating film.

2. The semiconductor device according to claim 1, wherein the Si—H bond density in the first insulating film is greater than or equal to $1.0 \times 10^{22}/cm^3$, the Si—H bond density in the second insulating film is less than $1.0 \times 10^{22}/cm^3$, the N—H bond density in the first insulating film is less than $1.0 \times 10^{22}/cm^3$, and the N—H bond density in the second insulating film is greater than or equal to $1.0 \times 10^{22}/cm^3$.

3. The semiconductor device according to claim 1, wherein a part of the first insulating film is formed on an end portion on a gate electrode side of the second insulating film.

4. The semiconductor device according to claim 3, wherein the end portion on the gate electrode side of the second insulating film coincides with an end portion on a drain electrode side of the gate electrode, when viewed in a direction normal to a surface of the substrate.

5. The semiconductor device according to claim 3, wherein the end portion on the gate electrode side of the second insulating film is inclined with respect to the direction normal to the surface of the substrate.

6. The semiconductor device according to claim 1, wherein the first insulating film is formed between the second insulating film and the gate electrode.

7. The semiconductor device according to claim 1, wherein the first semiconductor layer is formed of a material including GaN, and the second semiconductor layer is formed of a material including AlGaN or InAlN.

8. A power supply device comprising the semiconductor device according to claim 1.

9. An amplifier comprising the semiconductor device according to claim 1.

* * * * *